United States Patent [19]

Ferriter et al.

[11] Patent Number: 4,862,376

[45] Date of Patent: Aug. 29, 1989

[54] BILL OF MATERIAL INTERFACE TO CAD/CAM ENVIRONMENT

[75] Inventors: Kate M. Ferriter, Atlanta, Ga.; Elaine R. Palmer, Yorktown Heights, N.Y.

[73] Assignee: International Business Machines Corp., Armonk, N.Y.

[21] Appl. No.: 113,837

[22] Filed: Oct. 28, 1987

[51] Int. Cl.[4] ............................................. G06F 15/21
[52] U.S. Cl. .................................. 364/468; 364/300; 364/403
[58] Field of Search ........ 364/403, 468, 300, 188–190, 364/400, 401, 512

[56] References Cited

U.S. PATENT DOCUMENTS

| | | | |
|---|---|---|---|
| 3,757,037 | 9/1973 | Bialek | 364/403 |
| 4,459,663 | 7/1984 | Dye | 364/300 |
| 4,509,123 | 4/1985 | Vereen | 364/300 |
| 4,646,238 | 2/1987 | Carlson, Jr. et al. | 364/468 |

Primary Examiner—Allen MacDonald
Attorney, Agent, or Firm—C. Lamont Whitham; Michael E. Whitham

[57] ABSTRACT

A method for interfacing between a product planning conceptual design tool and a CAD/CAM environment allows an indented bill of materials to be imported to the CAD/CAM environment while retaining the characteristics as a primitive text file. The conceptual design tool uses a sketch sheet approach on a computer display to enter the functional design of a new or modified product, thereby encouraging the designer to use a top down approach to the design process. The user keys in item information, and the system automatically draws a hierarchical tree structure on the computer display. The system then automatically generates an indented bill of materials which is stored in a graphics standard file that retains the character of text primitives. From this file an image of the bill of materials can be displayed in the CAD/CAM environment. The designer can use this image as an aid in the design process. Item names and numbers can be copied from the displayed bill of materials to the CAD/CAM image. The bill of materials can also be edited in the CAD/CAM environment and the edited bill of materials can then be reconstructed in the conceptual design tool for use in the continuing design and planning process.

5 Claims, 10 Drawing Sheets

```
1 X X X X X X
  2 X X X X X X X
      6 X X X X X X X
      7 X X X X X X X
  3 X X X X X X X
  4 X X X X X X X
      8 X X X X X X X
  5 X X X X X X X
      9 X X X X X X X
      10 X X X X X X X
```

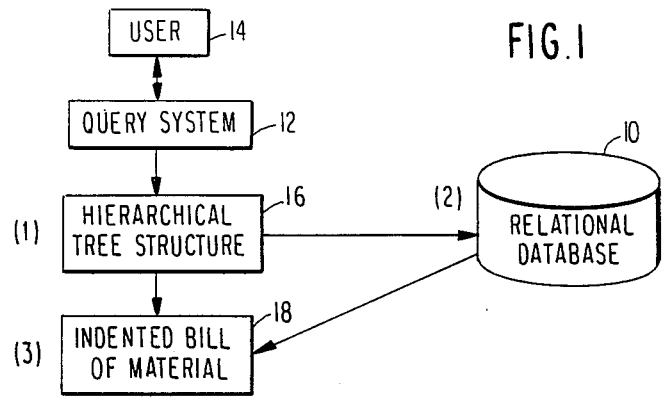
FIG.1
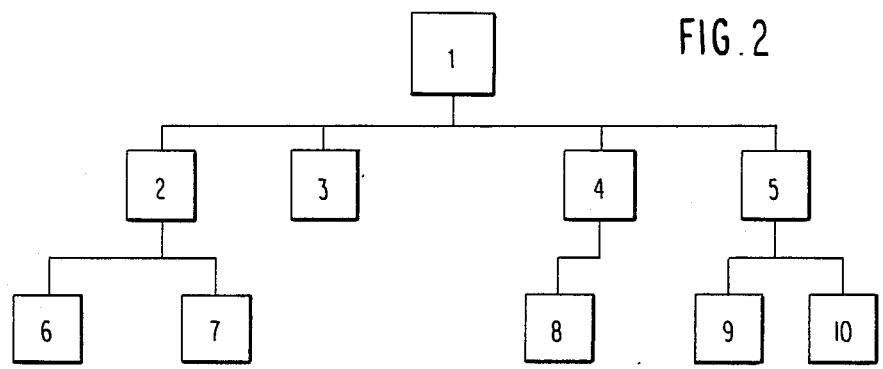
FIG.2
FIG.3
| ITEM | |
|---|---|
| 1 | 2 |
| 1 | 3 |
| 1 | 4 |
| 1 | 5 |
| 2 | 6 |
| 2 | 7 |
| 4 | 8 |
| 5 | 9 |
| 5 | 10 |
| 6 | — |
| 7 | — |
| 8 | — |
| 9 | — |
| 10 | — |
FIG.4
```
1 X X X X X X X
 2 X X X X X X X
    6 X X X X X X X
    7 X X X X X X X
 3 X X X X X X X
 4 X X X X X X X
    8 X X X X X X X
 5 X X X X X X X
    9 X X X X X X X
    10 X X X X X X X
```

```
┌─────────────────────────────────────────────────────────────┐
│ ,ıll                                                   ▲ ▪┃│
│ ┌─────────┐                                         ┌──────┐│
│ │DEFAULT EXIT│     EARLY MANUFACTURING INVOLVEMENT DATA │F1=HELP││
│ └─────────┘                                         └──────┘│
│                                                             │
│  * DEFAULT VALUES                                           │
│                                                             │
│         DETAILS FOR                                         │
│         ITEM NUMBER                        BATTERY          │
│         IN ASSEMBLY                                         │
│         TYPE                               LAWNMOWER        │
│         SOURCE STRATEGY                                     │
│         COMPANY                            PURCHASE COMPLETE│
│         QUANTITY OF THIS ITEM USED         SEARS            │
│         FUNCTION WITHIN PRODUCT            1                │
│         MATERIAL OF ITEM                   POWER UNIT       │
│         BUILD PROCESS                                       │
│            LEAD TIMES                                       │
│         TOOLING                                             │
│         PROCUREMENT                                         │
│         COMMODITY TYPE                                      │
│         COST                                                │
│         ITEM CLASSIFICATION                                 │
│                                                             │
│  ┌─────┐ ┌────────┐ ┌───────┐                               │
│  │ENTER│ │F1= HELP│ │F3=EXIT│                               │
│  └─────┘ └────────┘ └───────┘                               │
└─────────────────────────────────────────────────────────────┘
```

FIG. 6

```
┌──────────────────────────────────────────────────────────┐
│ DEFAULT  EXIT                                    F1=HELP │
│          EARLY MANUFACTURING INVOLVEMENT DATA            │
│                                                          │
│  * DEFAULT VALUES                                        │
│                                                          │
│      DETAILS FOR                 BATTERY                 │
│      ITEM NUMBER                 H000                 *  │
│      IN ASSEMBLY                 LAWNMOWER           *   │
│      TYPE                        MAIN ASSEMBLY-Z     *   │
│      SOURCE STRATEGY             PURCHASE COMPLETE       │
│      COMPANY                     SEARS ROEBUCK, INC.     │
│      QUANTITY OF THIS ITEM USED  1                       │
│      FUNCTION WITHIN PRODUCT     POWER UNIT              │
│      MATERIAL OF ITEM                                    │
│      BUILD PROCESS               ASSEMBLY            *   │
│         LEAD TIMES                                       │
│      TOOLING                     0                  **   │
│      PROCUREMENT                 2 WEEKS                 │
│      COMMODITY TYPE                                      │
│      COST                        15.00    *             │
│      ITEM CLASSIFICATION         IRS231Z             *   │
│                                                          │
│  (ENTER) (F1=HELP) (F3=EXIT)                             │
└──────────────────────────────────────────────────────────┘
```

FIG. 7

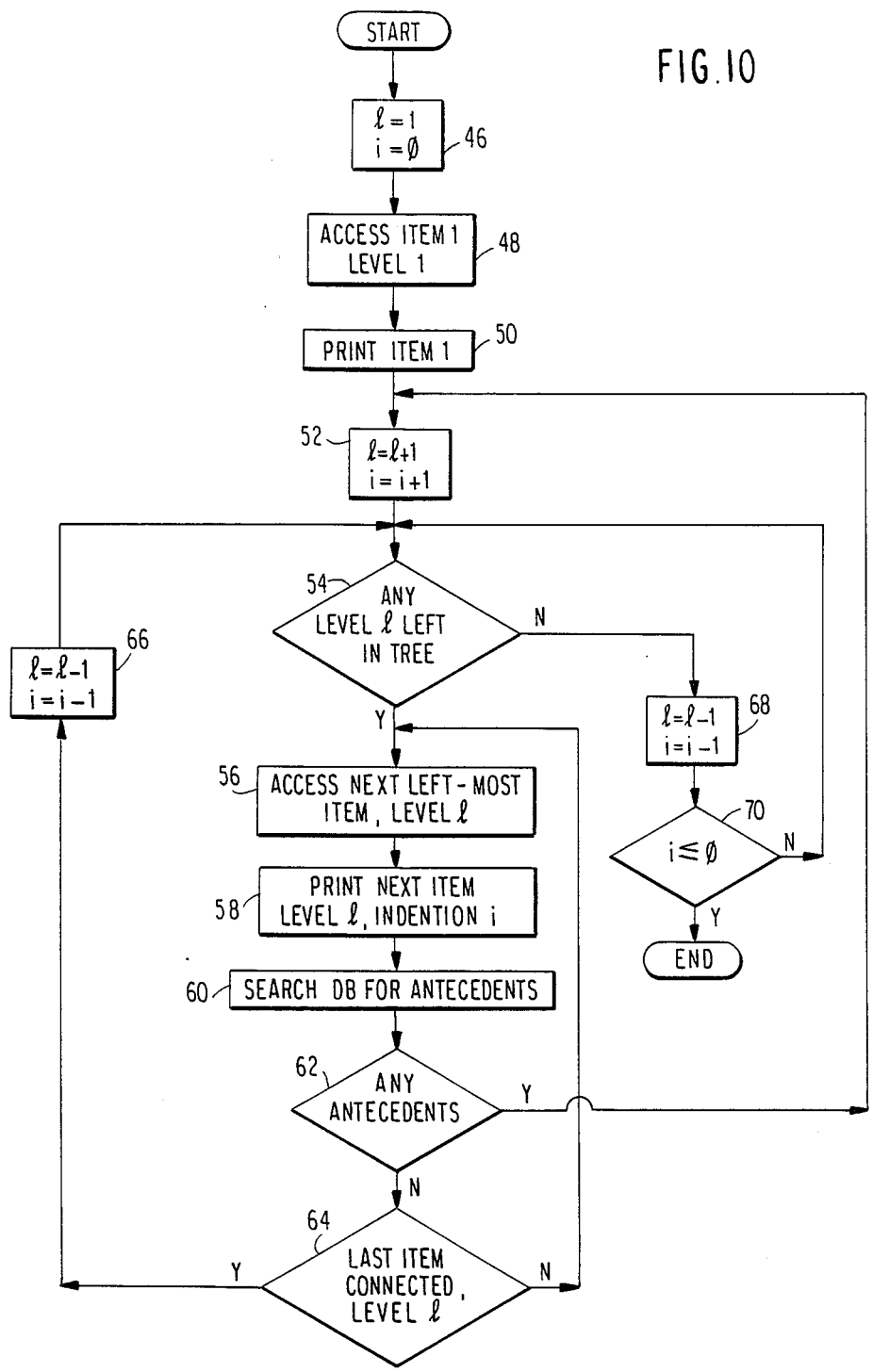

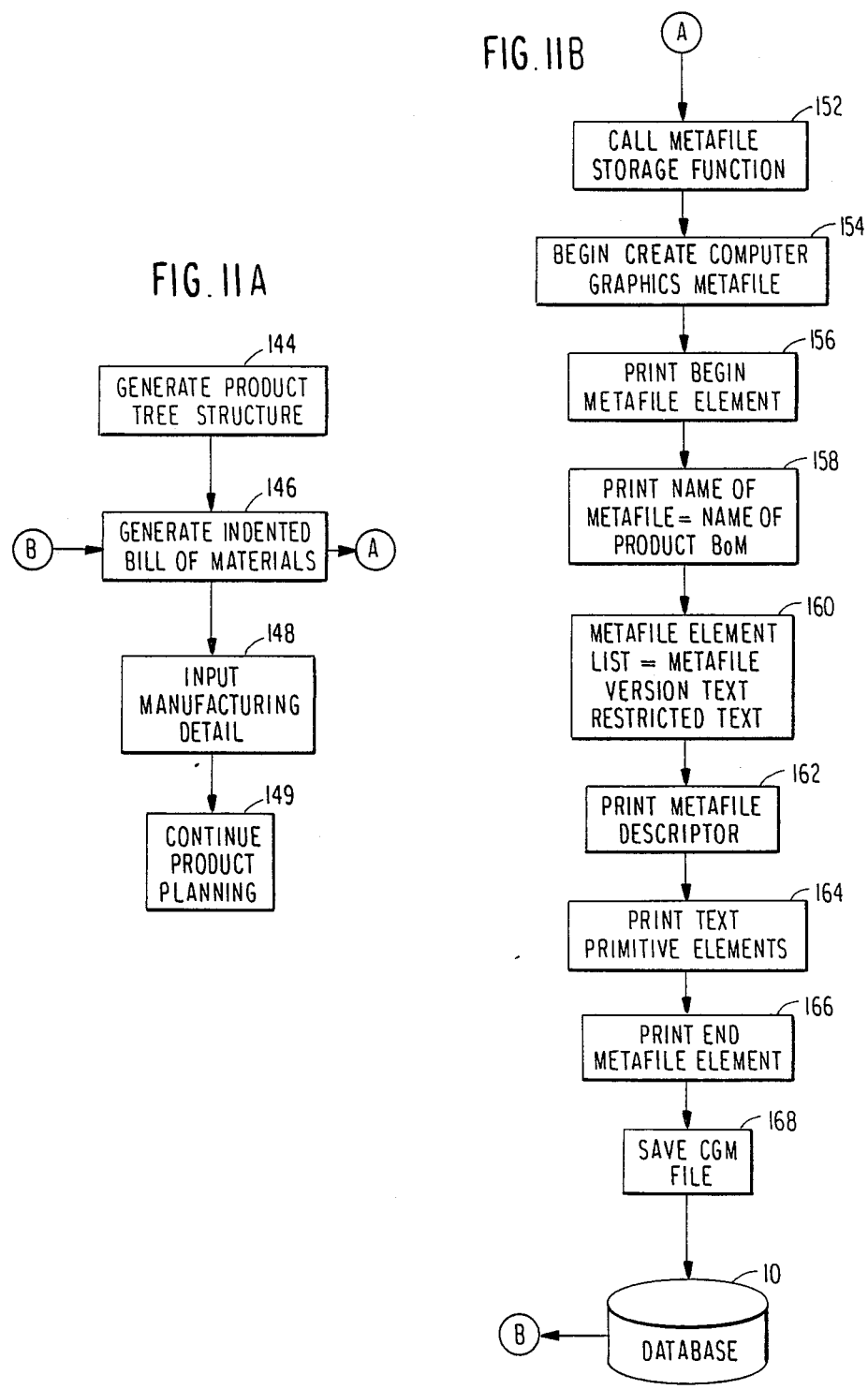

BILL OF MATERIAL INTERFACE TO CAD/CAM ENVIRONMENT

BACKGROUND OF THE INVENTION

1. Field of the Invention

The present invention generally relates to a computer based project management system and, more particularly, to a system, based on a top down functional approach to hardware product design, which provides an interface for importing an indented bill of materials into a CAD/CAM environment as an aid to the product designer in the detailed design phase of the product.

2. Description of the Prior Art

The process of designing, developing and manufacturing a new product, or making major changes to existing products, presents many challanges to product managers and engineers to bring the product to market for the least cost, within schedule while maintaining product quality. In today's highly competitive industries, product managers and engineers require information to address many problems that arise because of the complexity of new products and the complexity of worldwide production and the changing nature of competition. Because new products need to be brought to market in a very short time period to meet the competition, the traditional learning curve formerly associated with product development has disappeared, creating the need to better control product release and determine cost impacts of design early in the design process.

To meet these needs, many companies are realizing that the conventional product design process is not satisfactory. They require early involvement of manufacturing engineering, cost engineering, logistics planning, procurement, manufacturing and service/support with the design effort. In addition, they require planning and control of product data through design, release and manufacturing.

Project Management, as a modern management tool, has its origins in the early part of this century when Henry L. Gantt, while working for the government during World War I, developed his now famous visual aid for work control. The Gantt chart is a graphic representation of a project schedule that shows each task as a bar having a length proportional to the duration of the task. Later during the 1950s, Dr. John Presper Mauchley, a co-inventor of the EDVAC at the University of Pennsylvania, developed the Critical Path Method (CPM) which was further developed by Willard Frazer, a consultant on the Polaris submarine project. Frazer's contribution was called Program Evaluation and Review Technique (PERT). A PERT chart is one that resembles a flow chart showing predecessor and successor tasks of a project and the critical path.

PERT/CPM models are known and have been used for many years by many large corporations for project management. Such project management tools were first implemented on main frame computers and then on mini computers, equipment which was readily available to large corporations but not to small corporations and firms. More recently, various project management software products have been developed for micro or so-called personal computers. An example of a project management tool which was originally written as a mainframe program and later rewritten as a personal computer program is *Plantrac*, published by Computerline, Inc. This program was originally written in England for the construction industry and later imported to the U.S.A. The first project management tool written specifically for the personal computer was called the *Harvard Project Manager*, now published by Software Publishing Corp. There are now over one hundred project manager applications written for personal computers. These have made computer based project management tools more economically accessible to small corporations and firms, but their application requires some degree of sophistication on the part of the user. As a result, many small corporations and firms still use manual methods of project management, often relying on an expediter to stay one step ahead in scheduling supplies and work on a day to day basis.

Rupert A. Schmidtberg and Mark A. Yerry in an article entitled "Designing Complex Assemblies Using the Top-Down Approach" published in *Autofact* 1986 *Proceedings*, at pages 9-31 to 9-43, describe a design approach where the engineer first creates the top-most assembly and works downward, filling in details of the subordinate subassemblies and parts. In this approach, a hierarchical representation of the design object is built and refined. As a design concept is refined, design constraints are communicated down the hierarchy. Evaluation of the design concept at each level of refinement may cause feedback to be passed up the hierarchy in the form of recommendations for design changes or requests to relax some design constraints.

This top-down design approach has significant advantages over the traditional approach to design of a new product. The Schmidtberg and Yerry implementation, however, is in the environment of a CAD/CAM system which assumes a different focus and a high degree of sophistication in using computers for design on the part of the user. What is needed is a simpler to use system which takes advantage of the top-down design approach. Such a system should also be capable of importing the functional and detailed design specifications and manufacturing/process details as available into the CAD/CAM environment as an aid to the product designer in the detailed design of the product.

SUMMARY OF THE INVENTION

It is therefore an object of this invention to provide an easy to use system which implements a top-down functional approach to hardware product design and provides an interface between the functional specification of the product and a CAD/CAM environment.

It is another, more specific object of the invention to provide a system which integrates a top-down design approach and prompts the new product designer by a graphic display of the product components, automatically creates an indented bill of materials, and provides an interface for the bill of materials and a CAD/CAM environment.

According to the invention, a sketch sheet approach on a computer display is used to enter the functional design of a product. The user needs to key in only part descriptions, and the system automatically draws a hierarchical tree structure on the computer display. The user is then prompted to consider, part by part, all of the parts in the product. A series of menus or "action bars" pop-up and guide the user through manufacturing planning for that part.

The process begins by producing a functional sketch of the product design. This sketch is in the form of a hierarchical tree structure, thereby encouraging the top-down design approach. The system queries or prompts the user for component parts of the product, and as the query process progresses, the tree structure is created on the computer screen for the user to view.

Behind each element, or item, in the functional hierarchy of the product, associated manufacturing information is gathered. This manufacturing detail is used for product release planning and scheduling, and manufacturing planning, as well as for feasibility level cost estimating. The user has the option at any time during the design process to deal with the proposed product or product components at a high level or at a very detailed level. At any level, manufacturing details which are not known by the user can be defaulted from a database using the known item attributes.

As the functional design progresses, the component specifications are captured in a table in the database. At any point in the design process, the system can automatically generate an indented bill of materials based on the data currently stored in the table. Each component is assigned an identification number, and this number is used to access the data in the table.

The product designer is aided in implementing early manufacturing involvement, or the integration of the design process with manufacturing and other production-related concerns. The designer is prompted to enter engineering planning and manufacturing data for each item in the product structure, thus introducing a third dimension to the hierarchical tree structure. This third dimension serves several purposes. The engineering and manufacturing data can be manipulated to produce needed estimates and schedules for the designer. The manufacturing data of interest falls under four categories: (1) information which assists in planning the manufacture of the product, (2) information which assists in producing a cost estimate of the product, (3) information which assists in generating a product release schedule, and (4) information which will assist a CAD/CAM designer in locating similar items. In the fourth instance, the designer then has the option to use the similar design, avoiding another design effort, or to use the existing design as a template to modify or for other guidance in preparing the new design.

The indented bill of materials, when used in the CAD/CAM environment, is used to guide the designer in detailed design. The designer is able to copy and place items from the bill of materials in the drawing itself rather than keying the item names and numbers manually. In addition, the designer can access standard drawings in a database by using the item numbers identified in the bill of materials.

BRIEF DESCRIPTION OF THE DRAWINGS

The invention will be better understood from the following detailed description of a preferred embodiment of the invention with reference to the drawings, in which:

FIG. 1 is a system block diagram showing the functional requirements for implementing the automated bill of materials which is used by the present invention;

FIG. 2 is a pictorial representation of a hierarchical tree structure showing the functional representation of the components of a new product;

FIG. 3 is a table illustrating the logical organization of the database for the hierarchical tree structure shown in FIG. 2;

FIG. 4. is a generalized illustration of an indented bill of material produced by the system from the relational database table shown in FIG. 3;

FIG. 6 is a screen illustrating the computer display of early manufacturing involvement data for one component of the structure shown in FIG. 5;

FIG. 7 is a screen illustrating the computer display of early manufacturing involvement data for one component with default data as entered by the system;

FIG. 10 is a flow chart showing the logic of the generation of the indented bill of materials shown in FIG. 4 using the table in the database;

FIGS. 11A, 11B and 11C, taken together, are a flow chart showing the logic of the bill of materials interface to a CAD/CAM environment.

DETAILED DESCRIPTION OF A PREFERRED EMBODIMENT OF THE INVENTION

Figure 5:
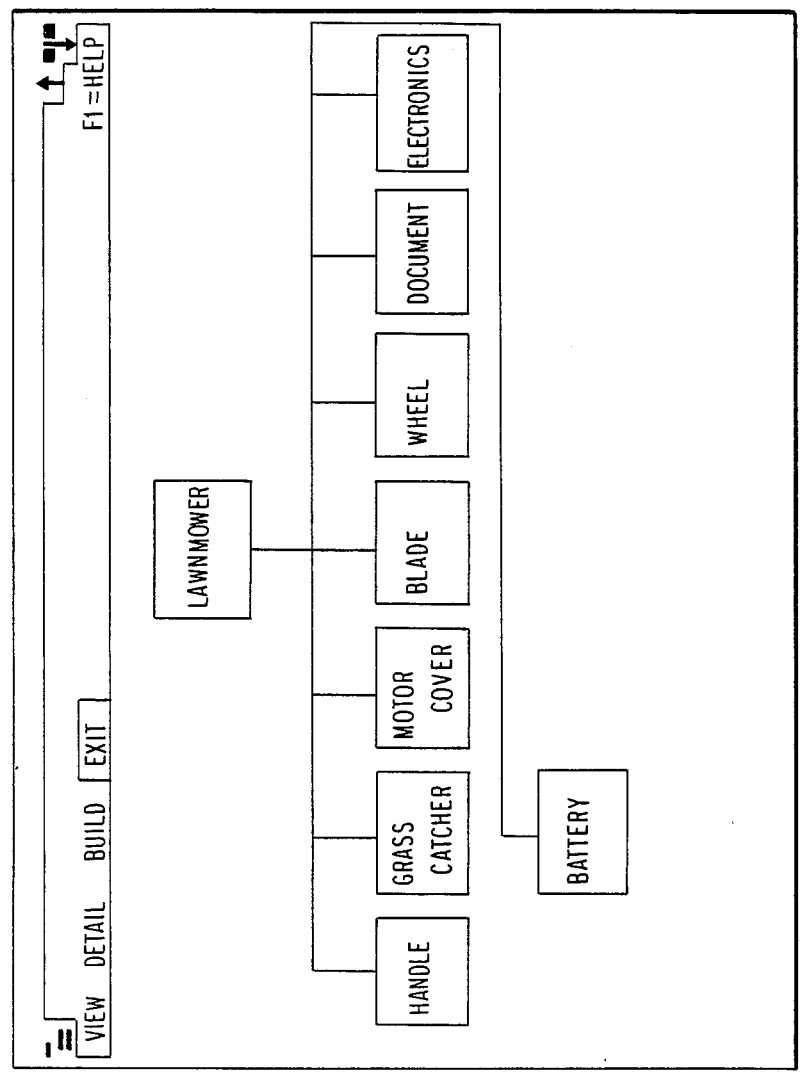
FIG. 5 is a screen illustrating the computer display of a hierarchical tree structure generated by the system for a planned product under design.

Referring now to the drawings, and more particularly to FIG. 1, there is shown in functional block diagram form the conceptual design tool according to the invention. The key parts of this system are the database 10 and the query system 12. The database 10 could be any of several products currently available, but for purposes of the preferred embodiment, IBM's DATABASE 2 (DB2) is used. DB2 is a relational database management system, but it will be understod by those skilled in the art that other databases, including hierarchical databases, could be used. The query system 12 could be an expert system, but for purposes of the preferred embodiment, IBM's Restructured Extended Executor (REXX) language is used. General information on IBM's DB2 can be had with reference to publication GC26-4073-2 published by IBM Corp. A description of the REXX language is provided in *Virtual Machine/Systems Product, System Product Interpreter User's Guide,* Release 4, publication SC24-5238-2.

The user 14 is first queried on the functional product structure by the query system 12, and in response to the user input, the database 10 captures the structure in a table. The query session begins by prompting the user to input the name of the product. The product might be a new lawnmower, for example, and the user would simply type in "LAWNMOWER". Then the query system asks the user to list the major components of the product. In the case of the lawnmower, this might be a handle, a grass catcher, a motor cover, a blade, wheels, documentation, electronics, and a battery. These would be individually entered by the user, in no particular order, in response to a prompt to enter the next component or indicate that there are no more major components by entering "END" or pressing a designated key. Once the major components have been entered by the user, the user enters "END" causing the query system to examine the subcomponents of the major components that have been entered. For example, the query system 12 would prompt the user 14 to enter the components of the handle. These components might be an upper handle assembly with controls and a lower handle assembly which attaches to the lawnmower frame. Again, when all the subcomponents for the handle have been entered, the user enters "END", causing the query system to next prompt the user to enter the components of the grass catcher, and so on. The process continues until the user has entered all the components of the new product to a level of detail desired, at least for the time being. It should be understood, however, that the user can return to the design session at any time and add more detail and/or change earlier input component data.

As the query session progresses, the components entered by the user 14 are captured in a table of the relational database 10 and a functional hierarchical tree of the structure 16 is generated on the computer screen. A generalized example of this hierarchical tree structure is shown in FIG. 2 of the drawings. If a subassembly appears more than one time in a product, the subassembly also appears multiple times in the tree. In this example, the tree structure has three levels. It may have as few as two levels and, within practical limits, an indefinite number of levels depending on the product and the level of detail required to define that product. In a specific embodiment of the invention, up to thirty leveles of the tree structure are allowed. Experience indicates that this is sufficient for all but the most complex of products.

The database 10 captures the component information from the user input in a table having the form shown in FIG. 3. Comparing this table to the hierarchical tree of FIG. 2, it will be observed that under the heading "ITEM" the numeral 1 is listed four times with the numerals 2, 3, 4, and 5 immediately to the right. This is followed by the numeral 2 listed twice with the numerals 6 and 7 immediately to the right. Thus, the table shown in FIG. 3 directly describes the hierarchical tree structure from which the graphical representation illustrated in FIG. 2 is generated for display on the computer screen. The user views this tree structure and can check it for correctness as it is generated and after the product is established by the end of the query session.

Referring back to FIG. 1, once the product structure is established, the next operation is to build an indented bill of material 18. For the product generally represented by the hierarchical tree structure shown in FIG. 2 and the relational database table shown in FIG. 3, the indented bill of material would have the general form shown in FIG. 4. Those skilled in the art will recognize that FIG. 3 shows the logical storage of the product data structure and FIGS. 2 and 4 show two, alternative representations of the data. This bill of material is built by accessing the database table for the product. The table is accessed by item number. In the top level, item 1 is not indented. The second level items 2, 3, 4, and 5 are indented one space. The third level items 6, 7, 8, 9, and 10 are each indented two spaces, and so on. The application code follows the item hierarchy as follows: Item 1 appears on the top line. Item 2 appears on the second line. Then the database is searched for item 2 antecedents. Items 6 and 7 would be found. Item 6 would then appear on the third line. The database is then searched for item 6 antecedents. In this example, none would be found, and item 7 would then appear on the fourth line. Again, the database is searched for item 7 antecedents, but again none would be found, and item 3 would appear on the fifth line. The remaining items are similarly processed until a complete bill of material is produced.

As a concrete example of the process described above, a specific hierarchical tree structure is shown in FIG. 5 of the drawings to the first level of detail of the design. FIG. 6 shows a screen from a computer display which would appear when the user selects, for example, BATTERY as the object and chooses the action "DETAIL". The design engineer keys in known manufacturing data using this screen. In this example, the designer intends to use an "off the shelf" battery to be purchased complete from Sears. There is one battery in the product structure, and its function is power unit. The user can then choose to have default values supplied from the relational database based on known item attributes. The user selects the action "DEFAULT", and the screen shown in FIG. 7 is displayed. The method by which the relational database can access these defaults is by accessing the table in which the user input data was captured during the query session. More specifically, the items in the table are accessed by item numbers and these numbers, in turn, are used as an index to access the default values for items, these values having been previously stored in the database. The screen shown in FIG. 7 displays the resultant default values, marked by an asterisk. The system has generated an item number, A000. From the position of the item within the tree, the system has determined that it is a Main Assembly. The full name of the vendor, Sears Roebuck, Inc., is inserted. The process by which the battery is incorporated into the product is assembly. Tooling leadtime defaults to zero since the item is purchased complete off the shelf. The cost per battery, based on actuals, is $15.00. An item classification, or group technology classification is system generated based on the function of this item within the product and the fact that it is purchased complete. This item classification code is used in many production planning functions, including scheduling and procurement.

Figure 8:
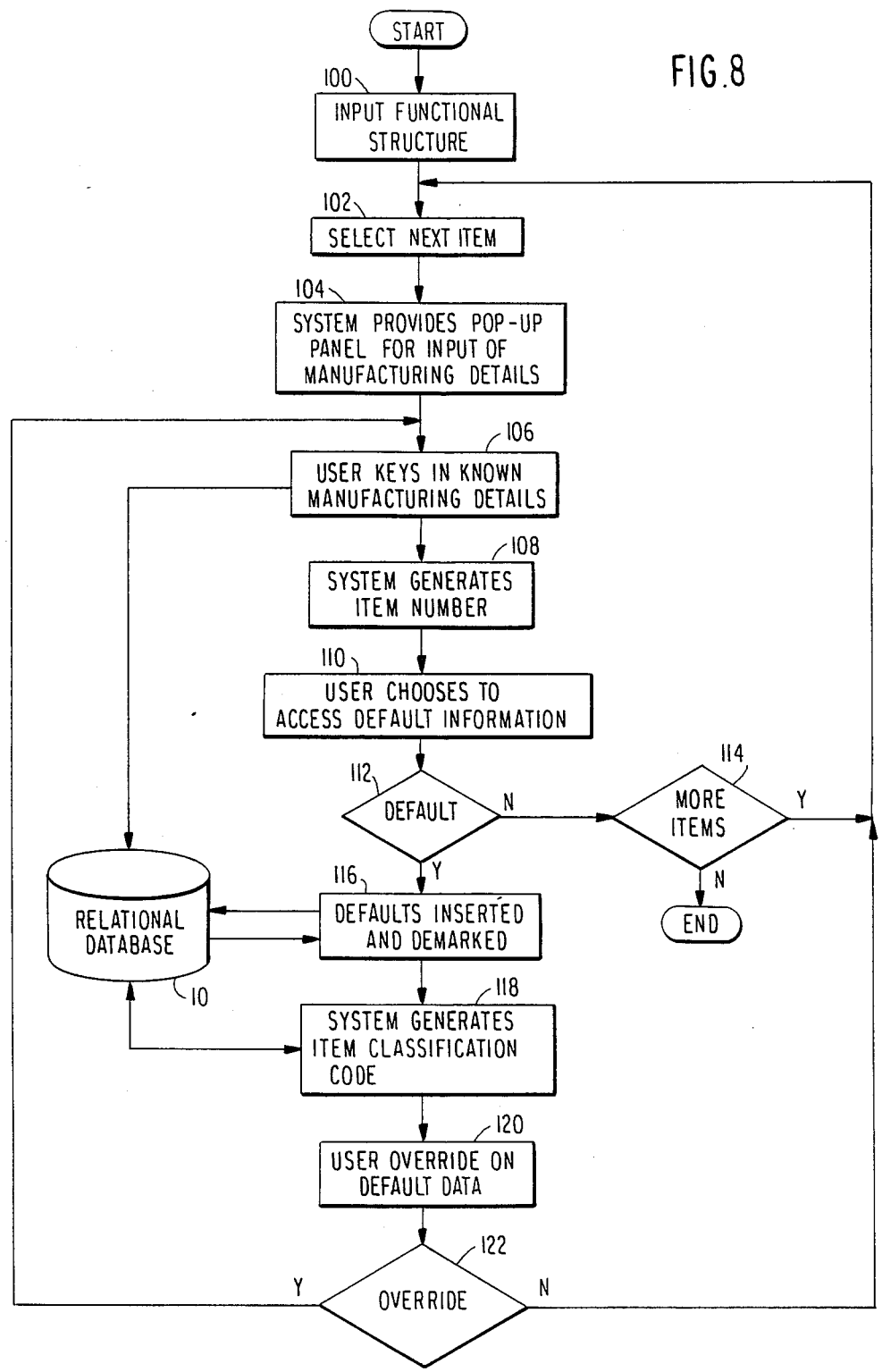
FIG. 8 is a flow chart showing the logic of the conceptual design tool.

Referring now to FIG. 8, there is shown a flow chart of the logic of the conceptual design tool according to the invention implemented in software. One of ordinary skill in the art can write source code from this flow chart in any suitable computer language, such as BASIC, Pascal or C, for any desired computer system, such as the IBM Personal System (PS) computers which support those computer languages.

The process begins by inputting the functional structure of the product as indicated by function block 100. This is done during the query session as is described in more detail with respect to FIG. 9. Once the functional structure of the product has been input and the hierarchical tree structure has been generated to the current level of detail desired, the user is prompted to select an item in the structure in function block 102. When the user selects an item, the system provides a pop-up panel for manufacturing details in function block 104. This pop-up panel allows the user to key in known manufacturing information in function block 106. When this information has been input by the user, the system generates an item number in function block 108. The system then allows the user to choose to access default information in function block 110. A test is made in decision block 112 to determine if the user has choosen to access default information. If not, a test is next made in decision block 114 to determine if there are more items for which manufacturing details are to be input. If so, then the process loops back to function block 102.

Assuming that the test in decision block 112 is positive, that is, the user chooses to access default information, then in function block 116, the system accesses the default values in database 10 and inserts those values.

Then, in function block 118, the system generates an item classification code. The user is given the option of overriding any of the default data in function block 120. A test is made in decision block 122 to determine if the user chooses to override any default data. If so, the system loops back to function block 106 which allows the user to key in known manufacturing data as a type-over of the previously inserted default data; otherwise, the system loops to function block 102 to select the next item in the functional structure of the product. Eventually, the test in decision block 114 will be negative, and the process ends.

Figure 9:
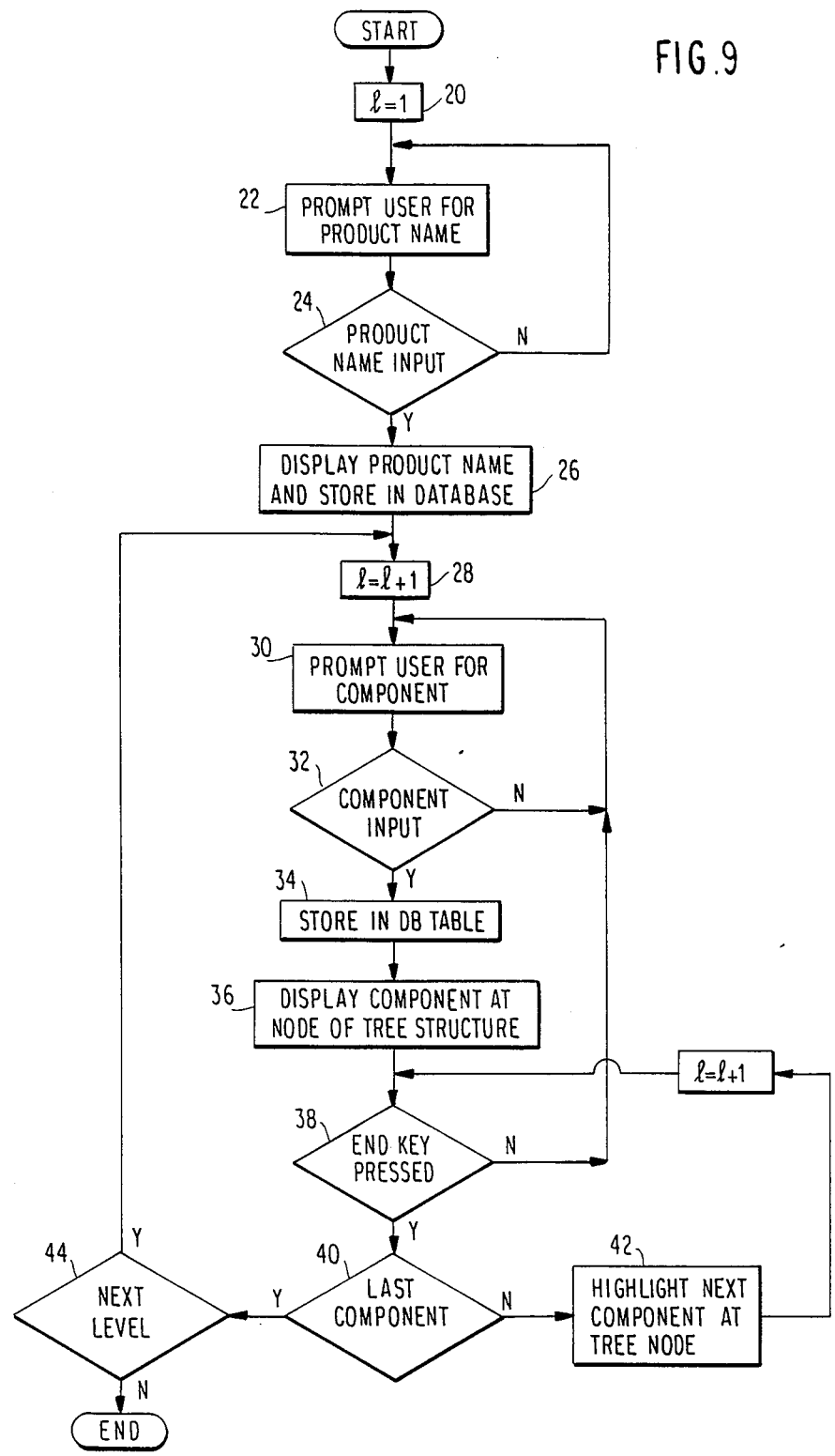
FIG. 9 is a flow chart showing the logic of the query session during which the hierarchical tree of FIG. 2 and the table of FIG. 3 is built.

FIG. 9 shows in flow chart form the logic of the query system according to the invention. The program logic represented by FIG. 9 is what builds the database represented by FIG. 3. This flow chart in combination with a dialog system such as IBM's REXX, and a database system, such as IBM's DB2, is sufficient for a programmer of ordinary skill in the art to write the required code to implement the query system. With specific reference to FIG. 9, the process begins by setting l=1 at block 20, where l is the product or component level. Then at function block 22 the user of the system is prompted for the product name. The system waits for a user input at decision block 24, and when the product name has been input, the system opens a file in the database with the product name and displays the product name on the computer screen in function block 26. In block 28, l is set to l+1 indicating the next level of components, and the system then prompts the user in function block 30 for the components of the product at this level. Each time the user inputs a component as detected by decision block 32, the inputted component is stored in the data base for that level in function block 34, and the system displays the inputted component on the computer screen at a node of the tree structure in function block 36. The system will continue to prompt the user for components after each component is entered by the user until the user presses an END function key which signals an end to the list of components for this level. Thus, the system tests the user input in decision block 38 for the END function key input. If that key input is not detected, then the system waits for the next user input in decision block 32, and when an input is received, the component is stored in the database table in fucntion block 34 and so forth.

Once all the components have been input by the user for a given level as indicated by pressing the END function key, the system then determines in decision block 40 if the last component in the current level of components has been input by the user. If not, the next component inthe current level is highlighted in the displayed tree structure, and the system loops back to function block 30 where the user is again prompted for components of this component. On the other hand, if the last component of the current level of components has been input by the user as detected in decision block 40, the system tests for a user input in decision block 44 to determine if components are to be entered for the next level. This is accomplished by the user pressing a Y key or an N key when prompted for the next level. If the Y key is pressed indicating that the user now wants to input the next level of components, the system loops back to block 28 to index the next level. If on the other hand, the N key is pressed indicating that the user does not at this time wish to input the next level of components or that there is no next level of components to enter, the query process ends.

Turning now to the flow chart of FIG. 10, this figure shows how the indented bill of materials is automatically generated from the table in the database which was built during the query session. Again, this flow chart shows the logic of the automatic generation of the indented bill of materials, and any programmer skilled in the art with an understanding of database systems such as the IBM DB2 database, can write code to implement the invention from the logic of the flow chart. The process begins in FIG. 10 by setting l=1 and i=0 in block 46, where l is the component level as before and i is the indentation of the bill of materials. Next, item 1 of level 1 is accessed in function block 48. Item 1 is then printed in function block 50, and l and i are then indexed by adding one to each. A test is then made in decision block 54 to determine if any level l is left in the tree. If so, the system accesses the next left-most item in the tree of the current level in function block 56. The accessed item is then printed in function block 58 with indentation i. A search is then made of the database in function block 60 for antecedents. If any are found in decision block 62, the sytem loops back to block 52 where the level and indentation are indexed by one. Otherwise, the last item of the current level has been connected. If so, the level and the indentation are indexed backward in block 66 by subtracting one from each. The process then returns to decision block 57 to continue the process of accessing and printing items in order. When the test in decision block 54 becomes negative, that is there are no levels left in the tree structure, the level and indentation are again indexed backward by subtracting one in block 68. A test is then made in decision block 70 to determine if the indentation i is less than or equal to zero. If not, the process loops back to decision block 54; otherwise, the indented bill of materials is complete and the process ends.

According to the preferred embodiment of the present invention, the indented bill of materials is stored in the format of the ANSI (American National Standards Institute) standard X3.122-1986, which is the Computer Graphics Metafile (CGM), although a similar standard could be used. The CGM standard is focused on the generation and transfer of device independent information which is sufficient for a picture to be drawn on a variety of graphics output devices. CGM is used to store an image of the structured bill of materials which can be displayed within a variety of CAD/CAM environments. Although it is an image within the CAD/CAM environment, the text characters are CGM primitives which retain their identity as text. These text characters can be manipulated within the CAD/CAM environment, and the bill of material image can be modified.

Any CAD/CAM system which uses the CGM standard can display the structured bill of material image. The bill of material image can be placed on one half of the CAD/CAM screen, or in a window, or on a separate display, or hot-button toggled, depending on the particular hardware being used. The designer can then copy the text within the bill of materials and place it on the CAD/CAM drawing. No part number keying is required, reducing the typing the designer needs to do. The displayed bill of materials can be used to guide the design drawing in the CAD/CAM environment. Updates to the structured bill of materials displayed on the CAD/CAM terminal can be made in the CAD/CAM environment, as long as the alphanumeric characters are retained as text primitives rather than vectors or pixels (raster fonts). New parts can be inserted, parts can be deleted, quantities can be changed, and the stucture can be changed.

Inserted parts are indented as appropriate in the image of the bill of materials structure. The x-position will be used to determine the level of that part when the bill of materials is stored in the relational database. The y-position is used to determine the position of the part relative to other parts (where used information). The x and y locations are used to establish needed "parent-child" relationships between parts in the structure and are used to update the relational database. The tables in the relational database contain product structure information necessary to either display the structure in the format of a hierachical tree or in the format of an indented bill of materials.

The updated bill of materials image within the CAD/CAM environment can then be stored in the CGM standard format. In this format, it can be used in the conceptual design tool, or for production planning functions.

Figure 11C:
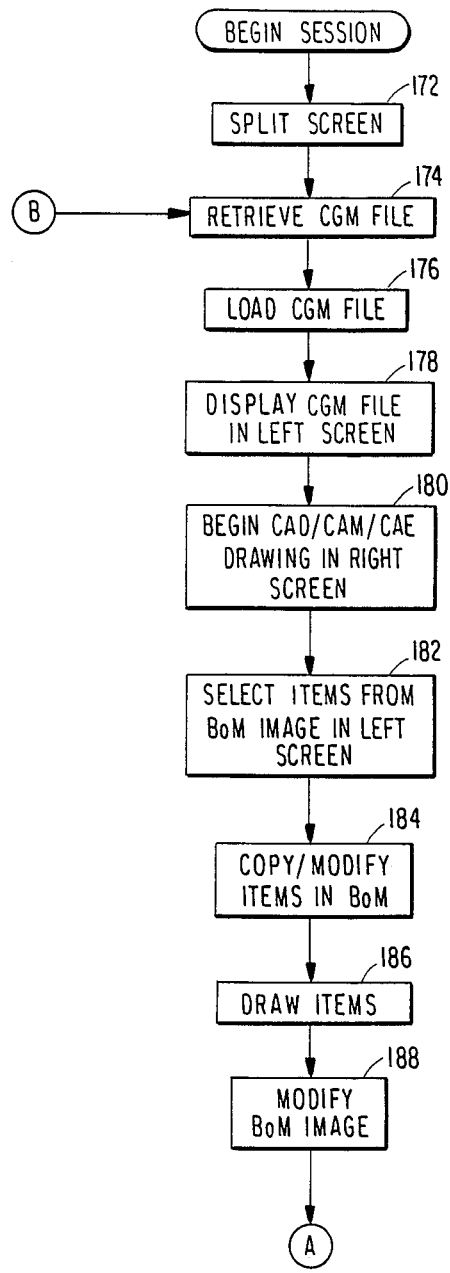

FIGS. 11A, 11B and 11C, taken together, show the flow chart of the logic for the interface of the indented bill of material to a CAD/CAM environment according to the invention. The flow chart is divided into three environments: the planning environment of FIG. 11A, the interface of FIG. 11B, and the design environment of FIG. 11C. The planning environment may be implemented with a personal computer such as an IBM Personal System 2 (PS/2) computer or a mainframe computer. The design environment may be implemented wth standalone work station such as the IBM RT (Risc Technology) PC or a work station connected to a mainframe computer such as an IBM 5080 or the equivalent. The key to the interface logic is the use of the ANSI standard CGM, and any programmer familiar with that standard, or a similar standard, can implement the invention from this flow chart.

The process begins in the planning environment of FIG. 11A by generating the product structure tree in function block 144 and creating the indented bill of materials in function block 146 using the conceptual design tool application. This process has already been described with reference to FIGS. 8, 9 and 10. The planning process continues with the input of manufacturing detail in function block 148.

The indented bill of materials produced in the planning environment is converted to a CGM graphics standard in FIG. 11B. The primitive text file stored in the CGM graphics standard can then be imported and displayed as an image in the design environment in FIG. 11C; that is, the CGM file is imported into a CAD/CAM application.

The process by which the indented bill of materials is formatted and stored in the CGM graphics standard begins by calling the metafile storage function in function block 152. Using this function, the process begins to create a computer graphics metafile in function block 154. The first step is to print the beginning metafile element in function block 156. Then, the name of the metafile, which is the name of the product being designed bill of materials, is printed in function block 158. The metafile element list is set to be equal to the metafile version of the text in function block 160, and the metafile descriptor is printed in function block 162. The primitive element text is printed in function block 164. This primitive element text is the body of the bill of materials. The previously computed indentation and levels of the bill of material are used to compute the x,y coordinates of the text in the metafile. When that is completed, the end metafile element is printed in function block 166. The CGM file thus created is saved in the database 10 in function block 170.

Referring now to FIG. 11B, the design session begins by splitting the display screen into two windows in function block 172. For example, the two windows might be displayed side-by-side with the left window for text and the right window for graphics. The two windows do not need to be same size, and the text window might be narrower than the graphics window.

In function block 174, the CGM metafile in database 10 is retrieved, and in function block 176, this file is loaded into the design application. The bill of materials CGM text file is imported into the text window of the display in function block 178. Once displayed, the bill of materials can be used as a design aid, allowing the designer to copy and place item names and numbers from the bill of materials into the drawing itself rather than keying the item names and numbers manually. The designer begins the drawing process in the graphics window in function block 180. The designer can select item names, tolerances and the like from the bill of materials image in the text window and import those names and tolerances to the graphics window, as indicated in function block 182. In this way, the designer is relieved of the burden of re-keying the text for insertion as legends in the graphics window. The process is one in which the designer simply moves the cursor from the graphics window to the text window, and by placing the cursor over the desired text, or at the beginning and end of a block of text, selects the text to be imported to the graphics window. The designer then moves the cursor back to the graphics window and selects the placement location for the text. The process can be accomplished in any convenient manner, such as dragging the text, and the particular technique is a matter of design choice to one of ordinary skill in the art.

Figure 12:
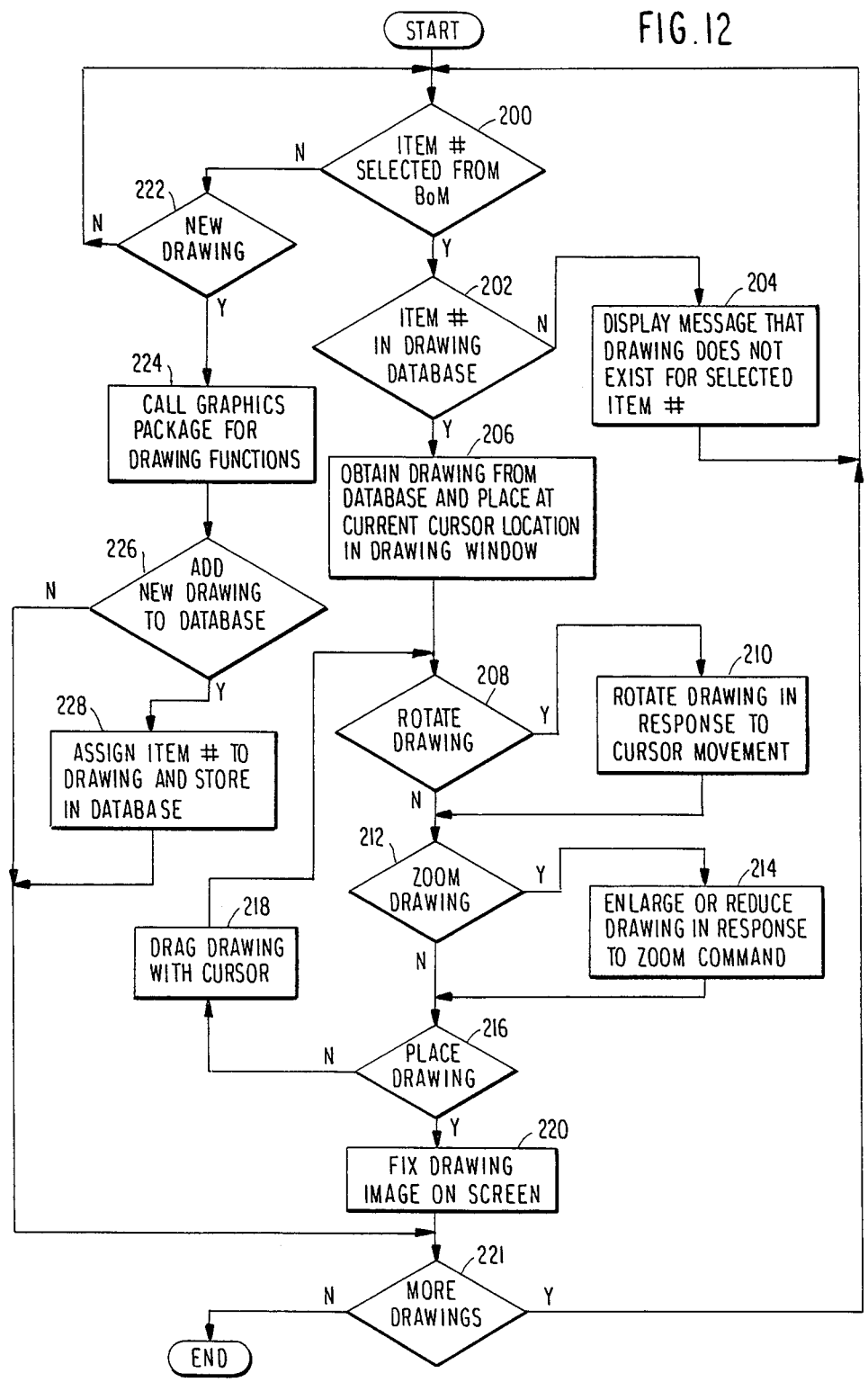
FIG. 12 is a flow chart showing in more detail the draw function of the interface shown in FIG. 11C.

If during the design process, the bill of materials requires modification, the designer can update the bill of materials in the displayed image of the text window by inserting or deleting items as indicated in function block 184. The only requirement is that the displayed bill of materials retain its character as text primitives. The items that make up the product are drawn in the graphics window as generally indicated by function block 186. A feature of the draw function is illustrated in FIG. 12, which is described in more detail hereinafter. When the designer concludes the CAD session, the bill of materials file is modified, as necessary, in function block 188 and is then stored in a CGM file as illustrated in FIG. 11B. The updated bill of materials is in this way returned to database 10. The conceptual design tool or other application package can then access the bill of materials from database 10 as indicated in FIG. 11A for use in continued planning activities 149.

The novelty of this concept is placing an image of the bill of materials into the CAD/CAM environment while retaining its character as text primitives allowing it to be used as an aid in the design process. As a result, the invention comprises an integral part of a top-down design process that causes the user to plan a proposed product in a hierarchical manner. After an initial product structure is done using the conceptual design tool, detailed CAD/CAM design can be done using the overall product structure by importing the bill of materials into the CAD/CAM environment. Moreover, modifications to the bill of materials can be made in the CAD/CAM environment and the modified bill of materials then can be moved back to the conceptual design tool for use in the continuing planning process.

As a further aid in the design process, the bill of materials image displayed in the text window of the work station display is used to access standard drawings in a drawing database. It is common in CAD systems to develop, or purchase, a library of standard drawings which may be imported into a current drawing. Architectual CAD systems commonly incorporate standard drawings for wall sections, doors, windows, and the like. The selection of these drawings is typically by inputting the drawing name or by selection from a graphics tablet menu.

According to one feature of the invention, the bill of materials in the text window becomes a menu for selecting standard drawings to aid in the design process. These drawings may, in the example of the lawnmower, be various items of hardware such as screws and bolts, wheels, battery, motor and so forth. The item or part number of the bill of materials is used to access the standard drawings, thus providing the designer with a custom menu for each product being designed. The process begins in decision block 200 where the user input is monitored to detect if an item number has been selected from the bill of materials. When an item number is selected, a determination is made in decision block 202 as to whether the selected item number is in the drawing database. If it is not, then in function block 204 a message is displayed to the user that a drawing for the selected item number does not exist, and the process loops back to decision block 200.

Assuming that the item number selected corresponds to a drawing in the database, then in function block 206 the drawing is obtained from the database and placed at the current cursor location in the graphics drawing window. The user is then given several choices as to what to do with the drawing. A few are shown in the drawing and will serve to illustrate the typical graphic editing functions which may be performed. For example, in decision block 208, the user is given the option of rotating the drawing image. If this option is chosen, the drawing image is rotated in response to cursor movement, for example, in function block 210. In decision block 212, the user is given the option of zooming the drawing; i.e., enlarging or reducing the size of the drawing. If this option is chosen, the drawing image is enlarged or reduced in response to the zoom command in function block 214.

The system monitors the user's input in decision block 216 to determine where the drawing image is to be fixed on the screen. This typically would be indicated by the press of a mouse button or an ENTER key. Until the user command is detected to fix the image on the screen, the system continues to drag the image of the drawing with the cursor in function block 218, and control loops back to decision block 208. However, at such time as the user command is detected, the image is fixed at the location indicated by the current position of the cursor. Then a test is made in decision block 220 to determine if there are more drawings to be made in this session. If not, the CAD session ends; otherwise, control loops back to decision block 200.

Considering again decision block 200, if an item number is not selected from the bill of materials, the user is given the option in decision block 222 of beginning a new drawing. If that option is selected, a graphics package is called in function block 224 for performing the drawing functions. The graphics package itself forms no part of the present invention and may be any of several commercially available packages, such as the CADAM ™ package sold by IBM Corp. Once the new drawing is made, the user is given the option of adding this drawing to the database of standard drawings in decision block 226. For example, assume that the user has just generated a handle assembly for the lawnmower and expects that this handle assembly will be used in other models. The user might then want to save the drawing as a standard drawing for later use in another design project. In that case an item or part number is assigned to the drawing in function block 228, and the process then goes to decision block 220. If the user chooses not to add this drawing to the database, the process goes directly to decision block 220.

The ability to use the item number from the text information which is displayed in the text window of the work station display to select standard drawings from the drawing database greatly simplifies the drawing, and hence the design, process. This can be accomplished again due to the fact that the bill of materials image is in the form of a primative text file, as opposed to a graphics file. Thus, the item or part numbers can be recognized by selection with the cursor for accessing the drawings from the database.

While the invention has been described in terms of a preferred embodiment, those skilled in the art will recognize that the invention can be practiced with modification and alteration within the spirit and scope of the appended claims.

Having thus described our invention, what we claim as new and desire to secure by letters patent is as follows:

1. A method for interfacing between a conceptual design tool and a CAD/CAM environment for implementing product design on a computer, comprising the steps of:
   prompting a user to input functional product structure data;
   capturing the product structure data input by the user in a database;
   generating a hierarchical tree structure of the product structure and displaying the tree structure to the user as the product structure data is captured in the database;
   generating an indented bill of materials for the product from the product structure data captured in the database and storing the indented bill of materials in the database;
   storing the indented bill of materials in a graphics standard as a primitive text file;
   displaying an image of the indented bill of materials in the CAD/CAM environment while retaining the character of the displayed image as a primitive text file.

2. The method recited in claim 1 further comprising the step of splitting a CAD/CAM display screen into a text portion and a graphics portion, the step of displaying the image of the indented bill of materials being performed by displaying said image in said text portion.

3. The method recited in claim 1 wherein display means are provided for displaying a text image and for displaying a graphics image, said method further comprising the steps of:
   loading said bill of materials for display as text image on said display means;

selecting text from said bill of materials text image; and importing selected text from said text image to said graphics image.

4. The method recited in claim 3 further comprising the steps of:

drawing items listed in said text image of said bill of materials, said drawing step being performed in said graphics image; and incorporating said text imported to said graphics image with drawn items in a graphics file.

5. The method recited in claim 3 further comprising the steps of:

modifying items in the text image of said bill of materials;

updating said bill of materials stored in said graphics standard as a primitive text file; and using the primitive text file, updating, the indented bill of materials stored in said database.

* * * * *